United States Patent
Or-Bach et al.

(10) Patent No.: US 8,390,326 B2
(45) Date of Patent: *Mar. 5, 2013

(54) METHOD FOR FABRICATION OF A SEMICONDUCTOR ELEMENT AND STRUCTURE THEREOF

(75) Inventors: Zvi Or-Bach, San Jose, CA (US); James M. Tour, Bellaire, TX (US); Jun Yao, Houston, TX (US); Brian Cronquist, San Jose, CA (US)

(73) Assignee: William Marsh Rice University, Houston, TX (US)

( * ) Notice: Subject to any disclaimer, the term of this patent is extended or adjusted under 35 U.S.C. 154(b) by 144 days.

This patent is subject to a terminal disclaimer.

(21) Appl. No.: 12/782,448

(22) Filed: May 18, 2010

(65) Prior Publication Data

US 2010/0289524 A1 Nov. 18, 2010

Related U.S. Application Data

(63) Continuation-in-part of application No. 12/435,661, filed on May 5, 2009, now Pat. No. 7,973,559.

(51) Int. Cl.
 *H03K 19/177* (2006.01)
(52) U.S. Cl. ............................... 326/41; 326/38; 326/39
(58) Field of Classification Search ............... 326/38–41; 365/96, 63, 225.7; 257/50, 529, 530
See application file for complete search history.

(56) References Cited

U.S. PATENT DOCUMENTS

| | | | |
|---|---|---|---|
| 5,258,643 A | 11/1993 | Cohen | |
| 5,485,031 A | 1/1996 | Zhang | |
| 5,614,756 A | 3/1997 | Forouhi | |
| 6,111,302 A | 8/2000 | Zhang | |
| 6,114,714 A | 9/2000 | Gangopadhyay | |
| 6,316,346 B1 | 11/2001 | Gangopadhyay | |
| 6,344,373 B1 | 2/2002 | Bhattacharyya | |
| 6,462,608 B2 * | 10/2002 | Cutter et al. ................... 327/525 |
| 6,584,029 B2 | 6/2003 | Tran | |
| 6,751,149 B2 * | 6/2004 | Seyyedy et al. ............ 365/225.7 |
| 6,767,769 B2 | 7/2004 | Hawley | |
| 6,841,846 B1 | 1/2005 | Chen | |
| 6,888,215 B2 | 5/2005 | Radens | |
| 6,919,613 B2 * | 7/2005 | Seyyedy et al. ................ 257/530 |
| 6,965,156 B1 | 11/2005 | Hawley | |
| 7,358,589 B1 | 4/2008 | Hawley | |
| 7,390,726 B1 | 6/2008 | Issaq | |
| 7,393,722 B1 | 7/2008 | Issaq | |
| 7,459,763 B1 | 12/2008 | Issaq | |
| 2007/0127303 A1 * | 6/2007 | Seyyedy et al. ............ 365/225.7 |

OTHER PUBLICATIONS

Li, et al., "Electronic two-terminal bistable graphitic memories", Nature Materials, 7:2008, pp. 966-971, Dec. 2008.
Dearnaley, et al., "Electrical phenomena in amorphous oxide films", Rep. Prog. Phys. 33:1970, pp. 1129-1191.
Yao, et al., "Etching-dependent reproducible memory switching in vertical SiO2 structures", 93:2008, pp. 235101 (3 pages), Dec. 2008.

* cited by examiner

*Primary Examiner* — Vibol Tan
(74) *Attorney, Agent, or Firm* — Winstead PC

(57) ABSTRACT

Re-programmable antifuses and structures utilizing re-programmable antifuses are presented herein. Such structures include a configurable interconnect circuit having at least one re-programmable antifuse, wherein the at least one re-programmable antifuse is configured to be programmed to conduct by applying a first voltage across it and is configured to be re-programmed not to conduct by applying second voltage across it, wherein the second voltage is higher than the first voltage. Additionally, the re-programmable antifuses may be configured to a permanently conductive state by applying an even higher voltage across it.

26 Claims, 11 Drawing Sheets

METHOD FOR FABRICATION OF A SEMICONDUCTOR ELEMENT AND STRUCTURE THEREOF

CROSS-REFERENCE TO RELATED APPLICATIONS

This application is a continuation-in-part of U.S. patent application Ser. No. 12/435,661, filed May 5, 2009, which is incorporated herein by reference in its entirety.

STATEMENT REGARDING FEDERALLY SPONSORED RESEARCH

This invention was made with Government support under Grant No. CNS-0720825 awarded by the National Science Foundation and Grant Nos. W911 NF-08-C-0133 and W911NF-08-C-0019 awarded by the United States Army Research Office. The Government has certain rights in this invention.

BACKGROUND

Semiconductor manufacturing is known to improve device density in an exponential manner over time, but such improvements do come with a price. The cost of a mask set required for each new process technology has also been increasing exponentially. While 20 years ago the mask set cost was less than $20,000, it quite common today to cost more than $1M for a state-of-the-art device mask set. These changes represent an increasing challenge primarily to custom products, which tend to target smaller volume and less diverse markets therefore making the increased cost of product development very hard to accommodate.

Custom Integrated Circuits (CICs) can be segmented into two groups. The first group includes devices that have all their layers custom made. The second group includes devices that have at least some generic layers used across the different custom products. Well known examples of the second group include Gate Arrays, which use generic layers for layers up to the contact layer, and field-programmable gate arrays (FPGAs), which utilize generic layers for all their layers. The generic layers in such devices are generally a repeating pattern structure in an array form. Logic array technology is based on a generic fabric that is customized for a specific design during the customization stage. For FPGAs, the customization is done through programming by electrical signals.

The most common FPGAs on the market today are based on static random access memories (SRAMs) as the programming elements. Floating-Gate Flash programmable elements are also utilized to some extent. Less commonly, FPGAs use an antifuse approach as the programming elements. The first generation of antifuse FPGAs used antifuses that were built directly in contact with the silicon substrate itself. The second generation moved the antifuse to the metal layers to utilize what is called the Metal-to-Metal Antifuse. These antifuses function as vias. However, unlike vias that are made with the same metal that is used for the interconnection, these antifuses generally use amorphous silicon and some additional interface layers. While in theory antifuse interconnection technology could support a higher density FPGA than SRAM interconnection technology, the SRAM FPGAs are dominating the market today. In fact, it seems that no one is advancing antifuse FPGA devices any longer.

One of the ongoing disadvantages of antifuse technology has been their lack of re-programmability. Another disadvantage has been special silicon manufacturing processes required for the antifuse technology, which results in extra development costs and the associated time lag with respect to baseline integrated circuit (IC) technology scaling. High voltage (HV) programming currents and voltages are another major obstacle for metal-to-metal (M2M) antifuse scaling. HV circuitry can even take 60% or more of the die area.

In view of the foregoing, improved antifuse technology would have considerable potential utility. Various embodiments of the current disclosure describe a re-programmable antifuse technology that can be reprogrammed many times and sometime thereafter transformed into a permanent conducting state. Such re-programmable antifuses are capable of being integrated into a complementary metal oxide semiconductor (CMOS) process.

SUMMARY

In various embodiments, integrated circuit devices are described in the present disclosure. The integrated circuit devices include a configurable interconnect circuit including at least one antifuse. The at least one antifuse is configured to be programmed to be conducting by applying a first voltage across it. The at least one antifuse is configured to be re-programmed to be non-conducting by applying a second voltage across it. The at least one antifuse is further configured to be permanently conducting by applying a third voltage across it. The third voltage is higher than the first voltage or the second voltage. In general, the second voltage is higher than the first voltage.

Other various embodiments of integrated circuit devices are also described herein. The integrated circuit devices include a configurable interconnect circuit arranged to be configurable by at least one antifuse. The at least one antifuse is configured to be activated by applying a first voltage across it. The at least one antifuse is configured to be programmed to be conducting by then applying a second voltage across it. The at least one antifuse is further configured to be re-programmed to be non-conducting by applying a third voltage across it. The at least one antifuse is still further configured to be permanently conducting by applying a fourth voltage across it. The fourth voltage is higher than the third voltage. In general, the third voltage is higher than the second voltage, and the first voltage is higher than the third voltage.

The foregoing has outlined rather broadly various features of the present disclosure in order that the detailed description that follows may be better understood. Additional features and advantages of the disclosure will be described hereinafter, which form the subject of the claims.

BRIEF DESCRIPTION OF THE DRAWINGS

For a more complete understanding of the present disclosure, and the advantages thereof, reference is now made to the following descriptions to be taken in conjunction with the accompanying drawings describing specific embodiments of the disclosure, wherein.

DETAILED DESCRIPTION

Figure 1:
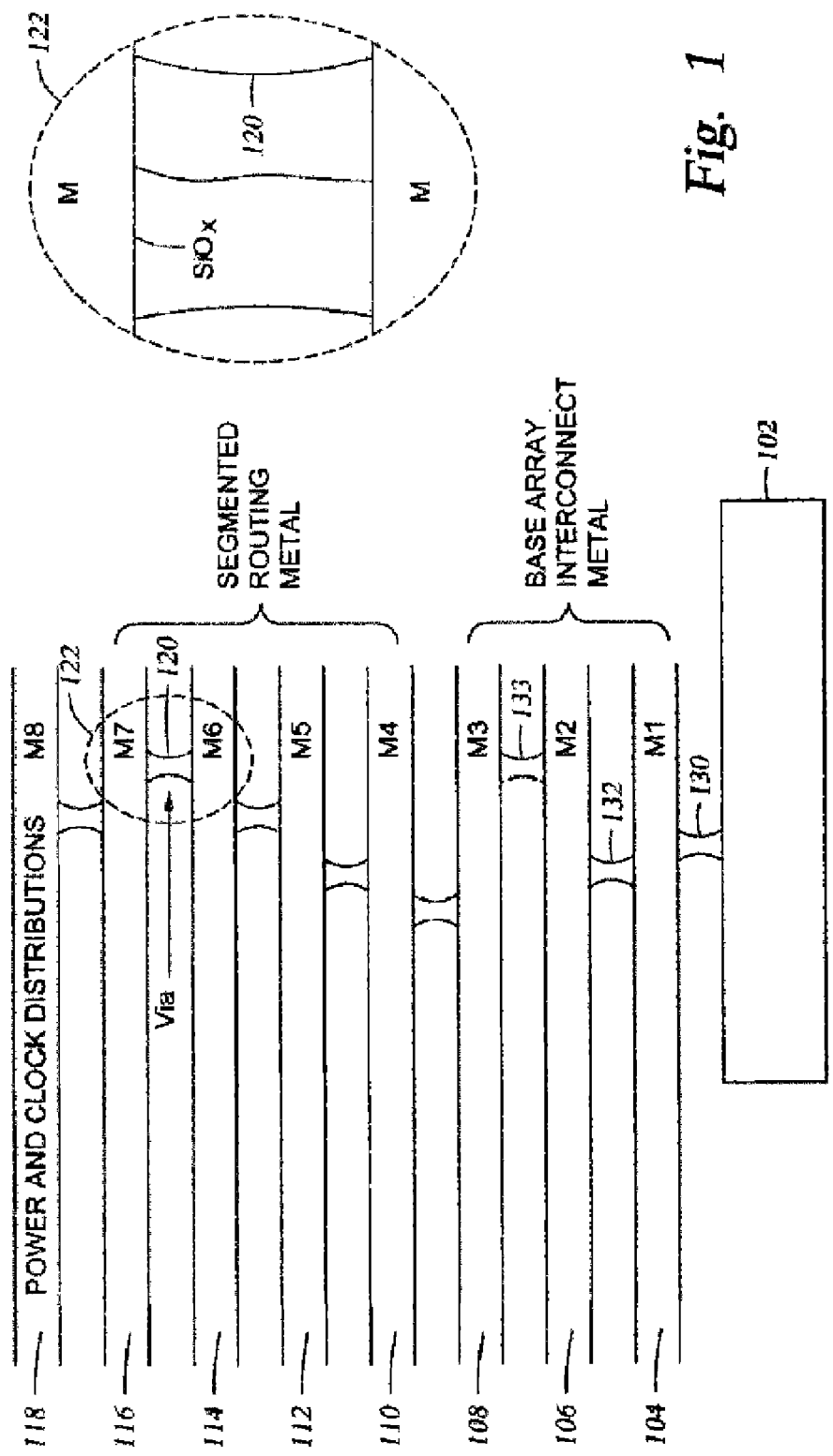
FIG. 1 presents a drawing illustration of a vertical cut of an illustrative semiconductor device.

In the following description, certain details are set forth such as specific quantities, concentrations, sizes, etc. so as to provide a thorough understanding of the various embodiments disclosed herein. However, it will be apparent to those of ordinary skill in the art that the present disclosure may be practiced without such specific details. In many cases, details concerning such considerations and the like have been omitted inasmuch as such details are not necessary to obtain a complete understanding of the present disclosure and are within the skills of persons of ordinary skill in the relevant art.

Referring to the drawings in general, it will be understood that the illustrations are for the purpose of describing particular embodiments of the disclosure and are not intended to be limiting thereto. Furthermore, drawings are not necessarily to scale.

While most of the terms used herein will be recognizable to those of ordinary skill in the art, it should be understood that when not explicitly defined, terms should be interpreted as adopting a meaning presently accepted by those of ordinary skill in the art.

Various embodiments of the present disclosure describe integrated circuit devices such as, for example, configurable logic arrays and fabrication methods for Field Programmable Gate Arrays (FPGAs).

In various embodiments, integrated circuit devices are described in the present disclosure. The integrated circuit devices include a configurable interconnect circuit including at least one antifuse. The at least one antifuse is configured to be programmed to be conducting by applying a first voltage across it. The at least one antifuse is configured to be re-programmed to be non-conducting by applying a second voltage across it. The at least one antifuse is further configured to be permanently conducting by applying a third voltage across it. The third voltage is higher than the first voltage or the second voltage. In general, the second voltage is higher than the first voltage.

Other various embodiments of integrated circuit devices are also described herein. The integrated circuit devices include a configurable interconnect circuit arranged to be configurable by at least one antifuse. The at least one antifuse is configured to be activated by applying a first voltage across it. The at least one antifuse is configured to be programmed to be conducting by then applying a second voltage across it. The at least one antifuse is further configured to be re-programmed to be non-conducting by applying a third voltage across it. The at least one antifuse is still further configured to be permanently conducting by applying a fourth voltage across it. The fourth voltage is higher than the third voltage. In general, the third voltage is higher than the second voltage, and the first voltage is higher than the third voltage.

There are provided in accordance with various embodiments of the present disclosure integrated circuit devices including an interconnect circuit configurable by a plurality of re-programmable antifuses. The re-programmable antifuses are programmed to electrically connect by applying voltage across the antifuses and then re-programmed to disconnect by applying an even higher voltage across the antifuses. In various embodiments, the re-programmable antifuses are programmed to permanently electrically connect by applying a still even higher voltage across the antifuses.

In various embodiments, the configurable interconnect circuit includes a first layer of conductive first strips, an insulation layer, and a second layer of conductive second strips. The conductive second strips are arranged in a substantially perpendicular orientation to the conductive first strips. In various embodiments, the insulation layer includes the at least one antifuse. The at least one antifuse is in a region directly above the conductive first strips and directly below the conductive second strips.

Various embodiments of the present disclosure provide new types of antifuses that are re-programmable many times. The antifuses can be constructed as a programmable via between conductive strips of a first metal layer and conductive strips of a second metal layer that is directly above it or as a programmable link between metal strip and metal via cap of the same metal layer. Further provided in accordance with embodiments of the present disclosure, the configurable interconnect circuit includes a first layer of conductive first strips, an insulation layer and a second layer of conductive second strips. The second strips are generally, but not necessarily, in perpendicular orientation to the first strips. Further provided in accordance with embodiments of the present disclosure, the insulation layer includes the plurality of re-programmable antifuses, wherein the plurality of antifuses are in the regions directly above the first strips and directly below the second strips. In various embodiments, the conductive first strips include metals such as, for example, copper or aluminum.

The re-programmable antifuses of various embodiments of the present disclosure can be programmed to conduct by applying a high voltage pulse to change the structure from a non-conductive state to a conductive state. By applying an even higher voltage, the conductive state of the structure changes back to a non-conductive state. The programming cycle can be repeated as many times as needed. In various embodiments, the antifuses can be programmed through thousands of switching cycles.

In further embodiments, the re-programmable antifuses of the present disclosure can be programmed to permanently conduct by applying a high voltage pulse to change the structure from either a non-conductive reprogrammable state or a conductive reprogrammable state to a permanently conductive state. By applying an even higher voltage pulse than that used to program the antifuses into a reprogrammable non-conductive state, the permanently conductive state is achieved. This higher voltage pulse to achieve the permanently conductive state may be close to or equal to the native $SiO_2$ breakdown voltage, or may be modified during construction of the antifuses to lower the permanently conductive state programming voltage.

In various embodiments, a two layer antifuse structure containing $SiO_x$, where one layer of $SiO_x$ has an x value substantially lower than 2 and the other close to 2 can lower the programming voltage. Antifuse structures having more than two layers are also within the spirit and scope of the present disclosure. In general, the programming voltage to achieve a permanently conductive state may be lower by having at least two layers of $SiO_x$ in which the value of x in each layer is not the same in each layer of $SiO_x$. There are also other ways for lowering the programming voltage. For example, ion implantation, plasma, or wet chemistry (e.g., etching with hydrofluoric acid solutions) may modify the edge of the anti-fuse structure and provide a lower permanent programming voltage. In other various embodiments, barrier metals, such as TiN and TaN as non-limiting examples, between the conductive metal layers and the antifuse can be utilized on one or both sides of the $SiO_x$ antifuse structure to lower the programming voltage and provide a higher conductivity ON, permanently conductive state. The latter embodiments are especially beneficial when combined with pulse trains during programming that promote early heating of the antifuse material and create a substantial metal, metal silicide, or metallic oxide link between the two metals layers of the configurable interconnect circuit.

In other embodiments of the antifuses of the present disclosure, an initialization step is also used, wherein a very high voltage is first applied to convert the antifuse from a non-conducting to a conducting state. Once initialized the re-programmable antifuse of this embodiment of the disclosure can be programmed to conduct by applying a high voltage pulse to change the antifuse structure from a non-conductive state to a conductive state. Thereafter, by applying an even higher voltage pulse, the antifuse structure is changed back to a non-conductive state. In various embodiments, the antifuses can be programmed through thousands of switching cycles. The switching cycle may be repeated as needed. In further embodiments, the antifuses can then be programmed to a permanently conductive state by applying a voltage pulse that is even higher than any of the aforesaid voltage pulses.

The re-programmable antifuses can include a $SiO_x$ dielectric where, for example, $1 \leq x \leq 2$. In various embodiments, the at least one antifuse includes $SiO_x$, wherein x has a value higher than 1 and less than or equal to 2. Further provided in accordance with various embodiments of the present disclosure, the antifuses include $SiO_x$. It is further provided in various embodiments that the value of x is higher than 1 and equal to or lower than 2. In various embodiments, an $SiO_x$ dielectric of the antifuse is initialized from a conductive to a non-conductive state, programmed to a conductive state and then changed again to a non-conductive state through application of voltage pulses. Further, the $SiO_x$ dielectric may then be transformed into a permanently conductive state by an even higher voltage pulse.

The re-programmable antifuses can include more than one $SiO_x$ dielectric layer where, for example, $1 \leq x \leq 2$. The x value of the first layer may not be equal to the x value of the second layer or any other subsequent layers. Having non-equal values for x in each $SiO_x$ layer may provide a lower initialization voltage or a higher current conductive state for an equivalent or lower current non-conducting state than a single layer structure. Additionally, a multiple dielectric layer antifuse may have a lower network load capacitance than a single layer structure for an equivalent programming voltage requirement. The different x values of the multiple layers may be accomplished by deposition of different film compositions by methods such as, for example, adjusting the deposition formation conditions, by ion implantation and annealing, or by plasma treatment of one or more of the layers. Other methods for changing the x values for $SiO_x$ in each layer may be envisioned by those having ordinary skill in the art.

Further provided in accordance various embodiments of the present disclosure, the antifuses include a carbon material. The antifuses of the present disclosure can also be constructed from a carbon material. In other various embodiments, the at least one antifuse includes carbon. The carbon material may be, for example, CVD-deposited in the form of amorphous carbon from hydrogen and acetylene, or by sputtering carbon. The carbon material can be a carbon layer, which may be viewed as nano-sheets of graphene. In various embodiments, the carbon material is a graphene. In various embodiments, the graphene is a graphene layer. In various embodiments, the graphene layer is a discontinuous graphene layer. Additionally subsequent annealing of the carbon material may optionally be performed at temperatures from about 400° C. to about 800° C. in some embodiments, from about 500° C. to about 700° C. in some embodiments, and from about 550° C. to about 650° C. in still other embodiments. In some embodiments, the annealing is conducted at about 600° C.

Further provided in various embodiments of the present disclosure is that the antifuses may also include a sacrificial layer. Since the graphene layers may initially be in the conductive state, a thin-film insulator such as a "sacrificial oxide" may be deposited so as to passivate the via by making it nonconductive. The sacrificial oxide may be "broken," for example, by using a voltage spike, in order to begin using such a graphitic via. After breakage of the thin insulating layer through a high voltage spike, the graphitic via may then be turned on (made conductive) by applying a high voltage pulse, and turned off (made non-conductive) by applying an even higher voltage pulse. In further embodiments, thin insulation layers may be put underneath the carbon layer, on top of it or even in the middle of it. Such insulation layers may also be used as an adhesion layer. In various embodiments, the at least one antifuse further includes a sacrificial layer.

In various embodiments, the second layer of conductive second strips further includes at least one strip of re-programmable antifuse oriented substantially perpendicularly with respect to the second strips. In various embodiments, the at least one strip of re-programmable antifuse is formed from $SiO_x$, wherein x has a value higher than 1 and less than or equal to 2. In various embodiments, the at least one strip of re-programmable antifuse is formed from carbon such as, for example, graphene. In various embodiments, the at least one strip of re-programmable antifuse further includes a sacrificial layer.

Further provided in accordance with various embodiments of the disclosure, the integrated circuit devices' second layer further includes very short strips of re-programmable antifuse, which may be perpendicularly orientated to the second strips. In accordance with these various embodiments, the re-programmable antifuse is formed from $SiO_x$, wherein x has a value higher than 1 and equal to or lower than 2. In accordance with other of these various embodiments, the re-programmable antifuse is formed from carbon, such as, for example, graphene. In other various embodiments, the antifuse also includes a sacrificial layer.

Further provided in accordance with various embodiments of the disclosure are described integrated circuit devices including a configurable interconnect circuit configurable by a plurality of re-programmable antifuses, wherein the plurality of re-programmable antifuses are activated to connect by applying a high voltage across it and then re-programmed to disconnect by applying first a low voltage across it and then applying a mid voltage across it, wherein the mid voltage is higher than the low voltage and lower than the high voltage. In further embodiments, the anitfuses may be configured to a permanently conductive state by applying another voltage pulse across the antifuses. The voltage pulse to achieve the permanently conductive state is even higher than the aforesaid voltage pulses.

Further provided in accordance with various embodiments of the disclosure are described antifuses having configurable interconnect circuits including a first layer of conductive first strips, an insulation layer and a second layer of conductive second strips, wherein the conductive second strips are generally in perpendicular orientation to the conductive first strips.

In various embodiments, the insulation layer includes a plurality of re-programmable antifuses, wherein the antifuses are in the regions directly above the conductive first strips and/or directly below the conductive second strips. In various embodiments, the antifuses are formed from $SiO_x$, wherein x is higher than 1 and equal to or lower than 2. In some embodiments, the antifuses are formed from carbon such as, for example, graphene. In various embodiments, the antifuses also include a sacrificial layer.

In various embodiments, the at least one antifuse includes more than one layer of $SiO_x$. In such embodiments, x has a value higher than 1 and less than or equal to 2, and the value of x is not the same in each layer of $SiO_x$. For example, in a two-layer antifuse structure, one layer of $SiO_x$ may have a value of x near 2 and one layer of $SiO_x$ may have a value substantially below 2.

Further provided in accordance with various embodiments of the disclosure, the integrated circuit devices' second layer further includes very short strips of re-programmable antifuse, which may be in a substantially perpendicular orientation to the second strips. In accordance with these various embodiments, the re-programmable antifuse is formed from $SiO_x$, wherein said x is higher than 1 and equal to or lower than 2. In some embodiments, the antifuse may include more than one layer of $SiO_x$ in which the value of x may range from 1 to less than or equal to 2, but the value of x is not the same in each layer of $SiO_x$. In accordance with other various embodiments, the re-programmable antifuse is formed from carbon, such as graphene. In other various embodiments, the antifuse also includes a sacrificial layer. In various embodiments, the conductive first strips are formed from metals such as, for example, copper and aluminum.

To more fully illustrate various embodiments of the present disclosure, reference is now made to the drawings, which describe certain elements of various embodiments presented hereinabove in more detail. The following drawing illustrations and descriptions are included to demonstrate particular aspects of the present disclosure. It should be appreciated by those of ordinary skill in the art that the described embodiments are merely illustrative and should not be taken as limiting. Those of ordinary skill in the art should, in light of the present disclosure, appreciate that many changes can be made in the specific embodiments described and still obtain a like or similar result without departing from the spirit and scope of the present disclosure. Drawings are not necessarily to scale.

FIG. 1 presents a drawing illustration of a vertical cut of an illustrative semiconductor device 100. The illustration shown is for an illustrative 8-metal-layer device. The first few layers may be dedicated for the construction of the logic cells using silicon substrate 102 wherein the various transistors may be fabricated. For example, the first two metal layers 104 and 106 may be connected through via layers 130 and 132 to construct logic cells. In some cases, third metal layer 108 may also be used for logic cell construction. The following metal layers, typically fourth metal layer to seventh metal layer (110, 112, 114, and 116), are used for interconnecting the logic cells for the construction of the logic circuit. The material used for any of the metal layers may be, for example, copper. Between the metal layers there may be an isolation dielectric layer. The dielectric layer may be $SiO_2$ or, in other processes, a low dielectric constant material instead of $SiO_2$, which may provide for better circuit performance. In a programmable logic device, the logic cells and their interconnection may be programmable. Electrically re-programmable antifuse 120 may be used for such programmable devices. The antifuse may be constructed like a via. Depending on the way antifuse 120 is programmed it may either connect (ON state) sixth metal layer 114 to seventh metal layer 116 or leave them unconnected (OFF state). An expanded illustration of antifuse 120 is shown in bubble 122. According to various embodiments, the re-programmable antifuse 120 may be formed from a silicon rich oxide, such as, for example $SiO_x$. Here, x can be 2, but may also be a value less than 2 and greater than 1, such as, for example, about 1.5. In some cases, an antifuse may be included between second metal layer 106 and third metal layer 108 as part of layer 13. Eighth metal layer 118 includes power and clock distribution capabilities.

Figure 2:
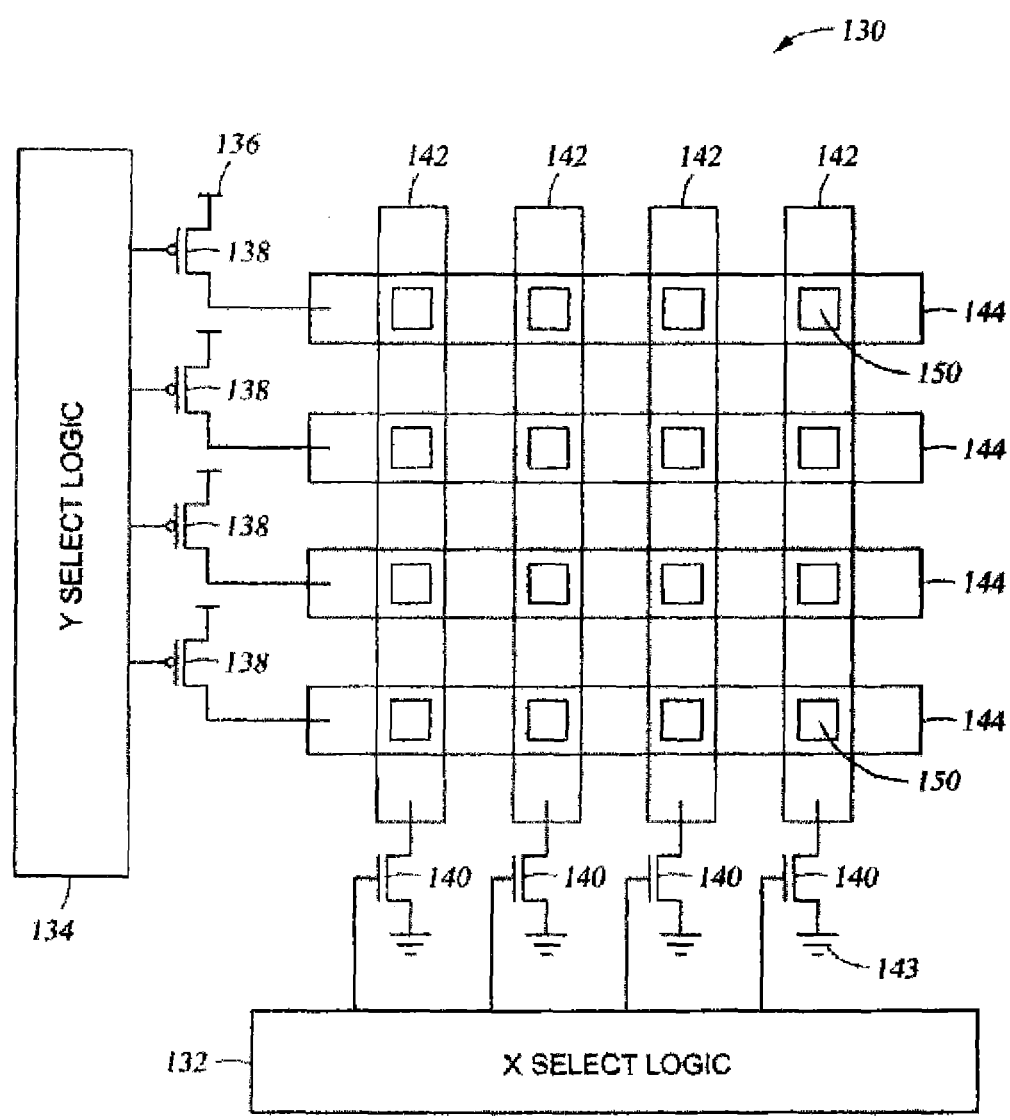
FIG. 2 presents a drawing illustration of an illustrative configurable interconnect structure.

The re-programmable antifuse 120 of FIG. 1 is to be better understood by referring to FIG. 2. FIG. 2 presents a drawing illustration of an illustrative configurable interconnect structure 130. Configurable interconnect structure 130 is formed from sixth metal layer strips 142 and seventh metal layer strips 144, wherein the sixth metal layer strips 142 are in substantially perpendicular orientation to the seventh metal layer strips 144. At the cross points between sixth metal layer strips 142 and seventh metal layer strips 144 there are re-programmable antifuses 150. To program the re-programmable antifuse 150, there are programming circuits having programming transistors 138 connected to the seventh metal layer strips 144 and controlled by Y select logic 134. Also included for programming are programming transistors 140 connected to the sixth metal layer strips 142 and controlled by X select logic 132. During the programming phase, the Y select logic 134 activates at least one of transistors 138 to an on state, and the X select logic 132 activates at least one of transistors 140. Accordingly, a voltage may travel across antifuse 150 from terminal 136 to terminal 143, which may be used for programming the antifuse 150. Programming will be described in more detail later.

Figure 3:
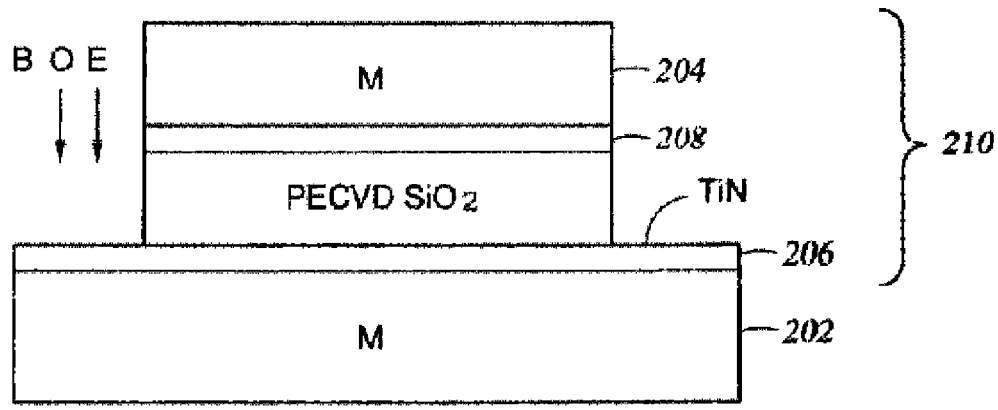
FIG. 3 presents a drawing of a vertical cut illustration of an illustrative re-programmable antifuse.

FIG. 3 presents a drawing of a vertical cut of an illustrative re-programmable antifuse 210. $SiO_x$ layer 208, wherein x can be 2, but may generally be a value less than 2 and greater than 1, such as, for example, about 1.5, may have, for example, a thickness of about 50 nm, and may be deposited by plasma enhanced chemical vapor deposition (PECVD), sputtering, or by deposition of $SiO_2$ with a subsequent silicon implantation and thermal annealing step. Adhesion layer 206 may be deposited over the underlying metal 202. The adhesion layer 206 may be formed from TiN or TaN, for example. Adhesion layer 206 could be deposited by, for example, physical vapor deposition (PVD) to provide a thickness of, for example, about 10 nm. The antifuse 210 may be defined, for example, by photolithography followed by reactive ion etching (RIE). Illustrative etching protocols include $BCl_3/Cl_2$ for TiN etching, and $CF_4/CHF_3$ for $SiO_x$ etching. A several-minute anneal at 500-700° C. in an $Ar/H_2$ environment is optionally performed after the etching is conducted. The $SiO_x$ layer is topped with a metal layer 204.

Figure 4:
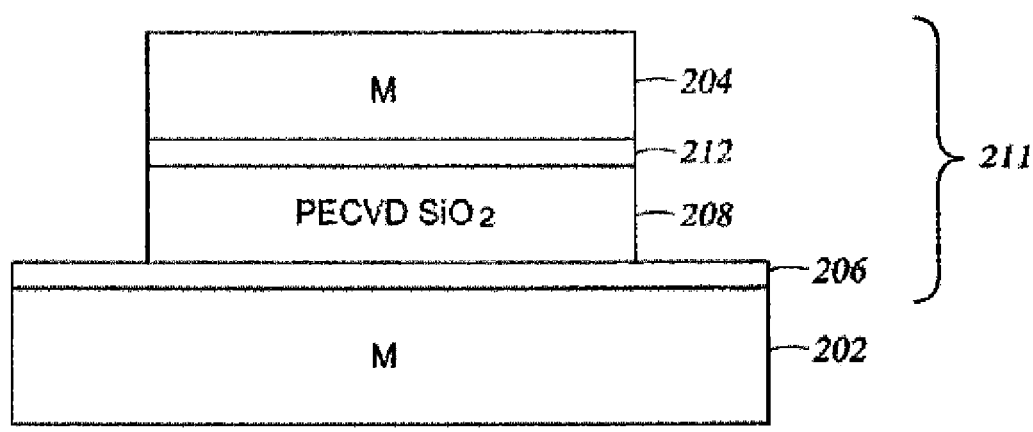
FIG. 4 presents a drawing of a vertical cut illustration of an illustrative re-programmable antifuse.

FIG. 4 presents a drawing of a vertical cut illustration of an illustrative re-programmable antifuse 211. Antifuse 211 is differentiated from antifuse 210 of FIG. 3 by also including a top adhesion layer 212. The top adhesion layer 212 could be of the same composition as adhesion layer 206 or be different. For example, the top adhesion layer 212 may be formed from Ti. Details concerning $SiO_x$ layer 208, adhesion layer 206, metal 202 and metal layer 204 have been set forth in FIG. 3.

Figure 5:
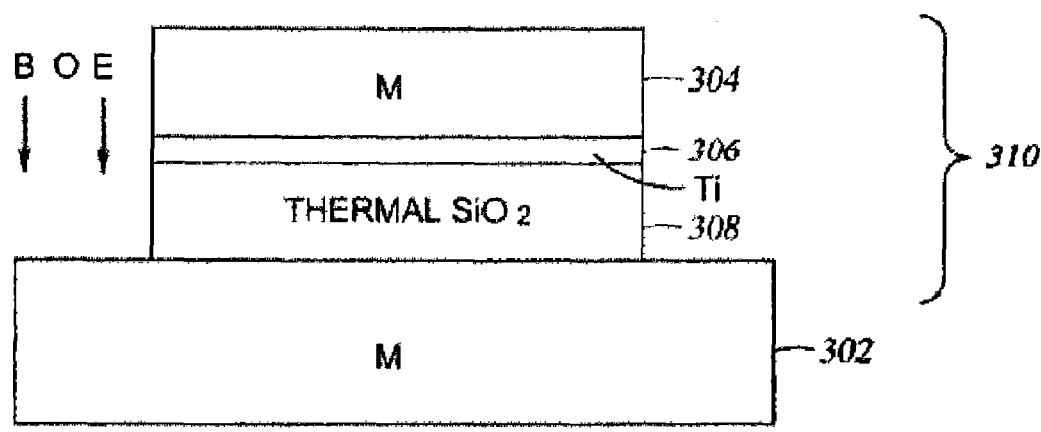
FIG. 5 presents a drawing of a vertical cut illustration of an illustrative re-programmable antifuse.

FIG. 5 presents a drawing of a vertical cut illustration of an illustrative re-programmable antifuse 310 according to additional embodiments of the present disclosure. Re-programmable antifuse 310 includes $SiO_x$ layer 308, wherein, x may be 2, but may also have a value less than 2 and greater than 1, such as, for example, about 1.5. $SiO_x$ layer may have a thickness of, for example, about 50 nm, and may be grown by, for example, PECVD. An adhesion layer 306 of Ti about 5 nm thick may then be deposited over $SiO_x$ layer 308. The antifuse pattern can be defined, for example, by a 10:1 buffered oxide etch (BOE) or reactive ion etching (RIE) dry etch. Antifuse 310 is deposited on metal 302 and topped by metal layer 304.

Figure 6:
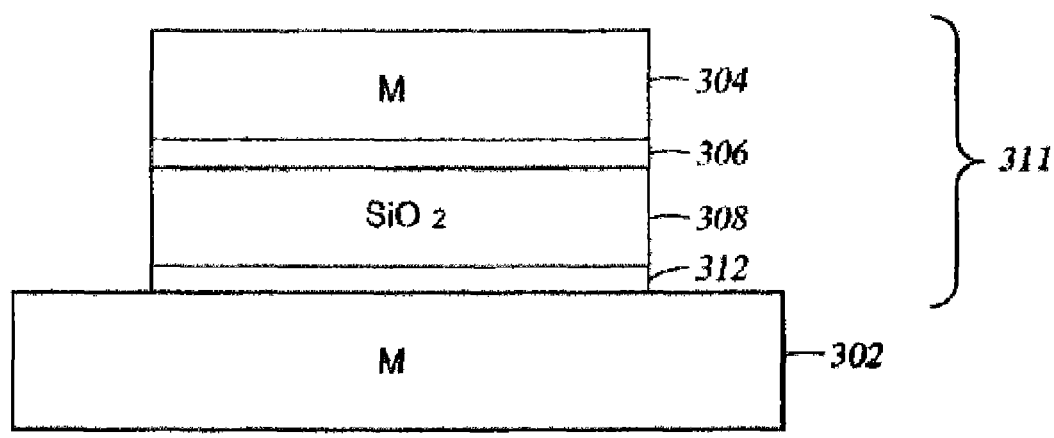
FIG. 6 presents a drawing of a vertical cut illustration of an illustrative re-programmable antifuse.

FIG. 6 presents a drawing of a vertical cut illustration of an illustrative re-programmable antifuse 311 according to additional embodiments of the present disclosure. In addition to the elements set forth in FIG. 5, antifuse 311 may also include a bottom adhesion layer 312. The bottom adhesion layer 312 can be of the same composition as the top adhesion layer 306 or it may be different. For example, the bottom adhesion layer can be formed from TiN. Details concerning $SiO_x$ layer 308, metal 302 and metal layer 304 have been set forth in FIG. 3.

Referring now to FIGS. 3, 4, 5 and 6, once the antifuse structure 210 or 310 has been defined, the remainder of the isolation layer between metal layers may be filled with, for example, a desired dielectric. Thereafter, using CMP and/or additional semiconductor manufacturing processes, for example, which may include lithography steps for the overlying metal, the rest of the device is fabricated. Alternatively the dielectric may be deposited first. Windows for the re-programmable antifuse may be defined, for example, using lithography and etch processes. $SiO_x$ may then be deposited to fill the windows. With a CMP or alternative steps, for example, the excess $SiO_x$ may be removed, and the process may continue to finish the wafer fabrication.

Figure 7:
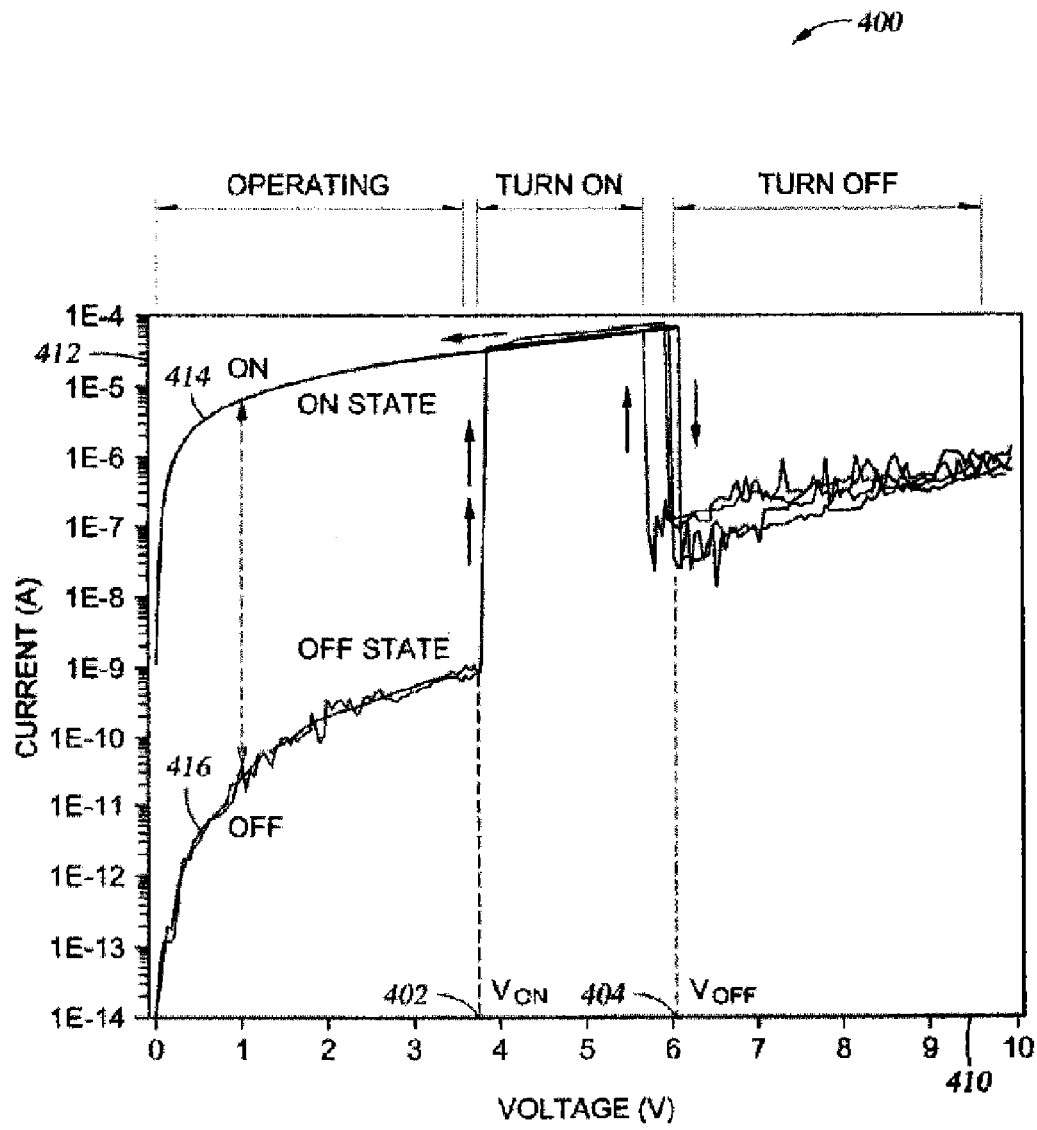
FIG. 7 presents a drawing illustration of an illustrative re-programmable antifuse current vs. voltage chart.

FIG. 7 presents a drawing illustration of an illustrative re-programmable antifuse current vs. voltage chart 400. The re-programmable antifuse may have two stable states OFF and ON. Initially the antifuse may be in the OFF state and thus non-conducting. The two axes in chart 400 are current in the vertical direction 412 and voltage in the horizontal direction 410. The antifuse may remain in the OFF state as long as the voltage across it does not exceed the $V_{on}$ threshold 402, which may be, for example, about 4 volts. $V_{on}$ threshold 402 may be a function of the re-programmable antifuse construction, including, for example, the thickness of the $SiO_x$ layer. The antifuse may be designed to be well over the operating voltage within the device so that normal operation does not cause a change to the re-programmable antifuse state. To turn the re-programmable antifuse to an ON state, a voltage exceeding the $V_{on}$ threshold 402 is applied. Once the antifuse has been turned ON it may then stay ON and conduct current 414. In the ON state the re-programmable antifuse acts as a conducting via and allows electronic signals to pass through it en route to their destinations. The re-programmable antifuse may be re-programmed to an OFF state by applying, for example, an even higher voltage across it, e.g., $V_{off}$ 404. Once the re-programmable antifuse has been programmed to an OFF-state, it conducts at a very low current 416 and stays at this low or essentially non-conducting state as long as the voltage across it does not exceed the $V_{on}$ threshold 402. This behavior of the re-programmable antifuse permits re-programming between OFF and ON states.

Figure 8A:
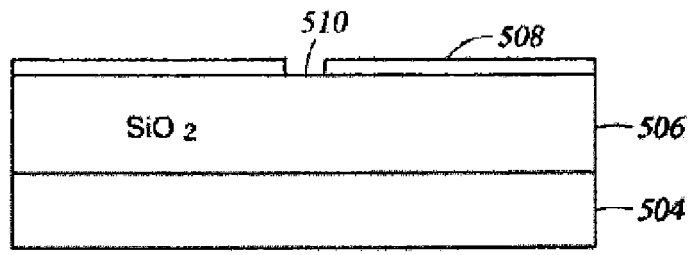
FIGS. 8A-8E present a drawing of a vertical cut illustration of steps involved in an illustrative re-programmable antifuse construction.
Figure 8B:
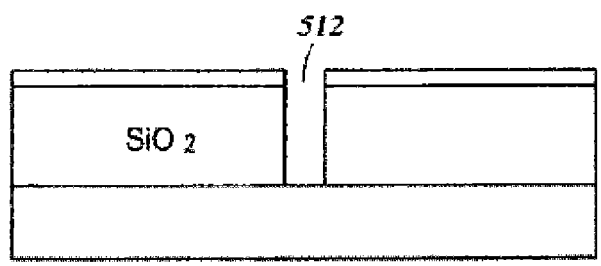
Figure 8C:
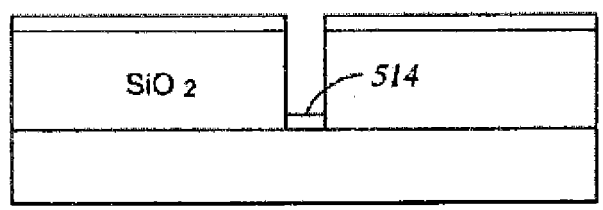
Figure 8D:
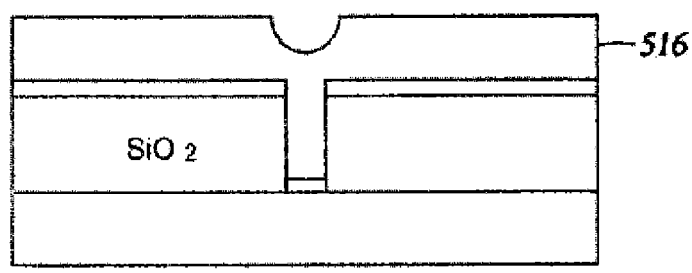
Figure 8E:
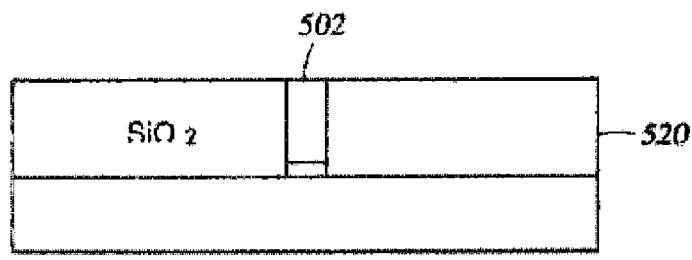

FIGS. 8A-8E present a drawing of a vertical cut illustration of steps involved in an illustrative re-programmable antifuse construction. FIGS. 8A-8E present certain steps in an illustrative construction of re-programmable antifuse 502 according to an embodiment of the disclosure. FIG. 8A shows an underlying metal strip 504 covered with an isolation layer 506 such as, for example, $SiO_2$. On top of isolation layer 506 is placed masked layer 508, which may be, for example, a photo-resist or hard mask pattern containing a hole 510 for the designated antifuse 502. FIG. 8B shows opening of the 'via hole' 512 in the isolation layer 506. FIG. 8C shows the addition of a "sacrificial oxide" 514 at the bottom of the 'via hole' 512. FIG. 8D shows the addition of graphitic or graphene carbon layer 516. The carbon layer is deposited, for example, by CVD in the form of amorphous carbon from hydrogen and acetylene or could be deposited by a sputtering process. A subsequent annealing step can also be performed. FIG. 8E shows the removal of excess carbon. Removal of excess carbon may be performed, for example, by a step of etch back or CMP to planarize the top layer and to leave a structure wherein the carbon is just in the via hole 520. Now the flow could continue as usual to construct the top metal layer strips and/or other structures.

The flow of FIGS. 8A-8E may be used to construct an antifuse having an $SiO_x$ layer as well. In an $SiO_x$ antifuse, "sacrificial oxide" 514 may be optionally excluded.

Referring again to FIG. 3, metal strips 142 and 144 to be used in conjunction with the antifuse may be made according to the choice of metal structure used in that semiconductor process. A common metal choice today is copper, for example. The copper BEOL flow could comprise the associated barrier metals to clad it.

Figure 9A:
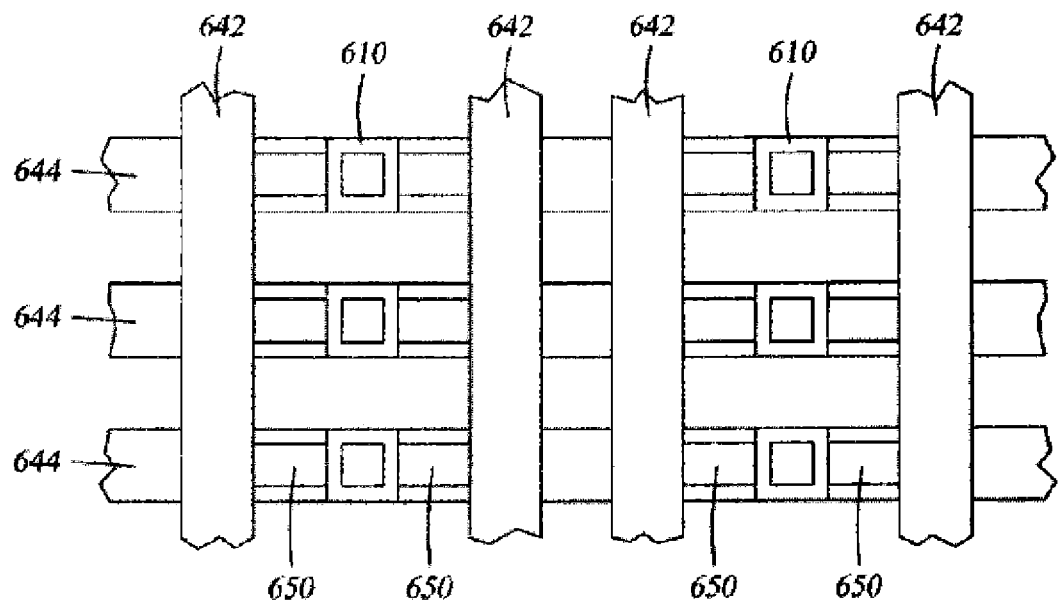
FIGS. 9A and 9B present a drawing illustration of an illustrative configurable interconnect structure.
Figure 9B:
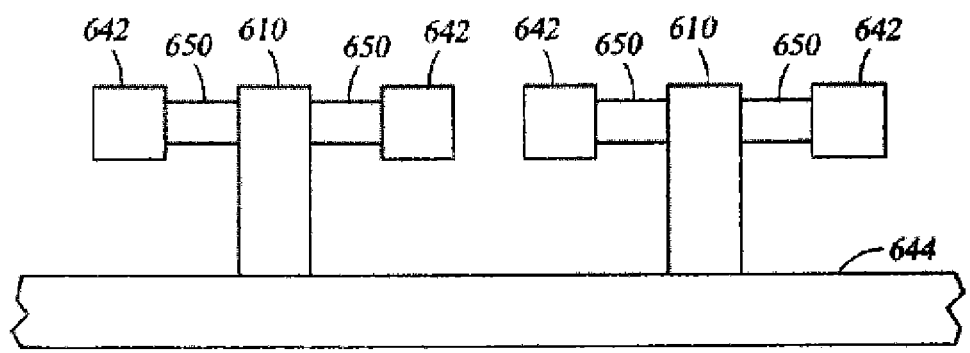

In various embodiments, connection of the antifuses in lateral form may be performed as depicted in FIGS. 9A and 9B. FIGS. 9A and 9B present a drawing illustration of an illustrative configurable interconnect structure. As shown in FIGS. 9A and 9B, the configurable interconnect structure utilizes lateral metal-to-metal antifuses 650. FIG. 9A is a top view and FIG. 9B is a vertical cut view. The structure includes lower metal strips 644, fixed vias 610, upper metal strips 642 which may be in substantially perpendicular orientation to the lower metal strips 644, and/or lateral antifuses 650 that provide programmable connection between the upper metal strips 642 and the lower metal strips 644. For better structure density two upper strips 642 may share one via 610 for the connection to the lower metal strips 644.

Figure 10A:
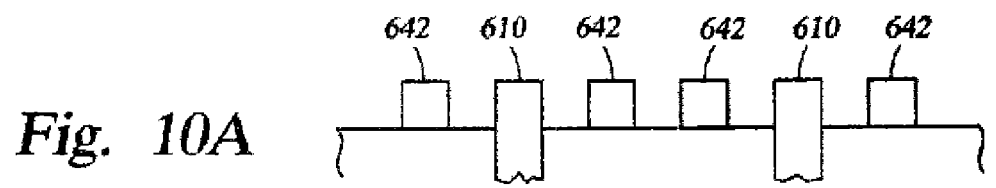
FIGS. 10A, 10B, 10C, 10D, 10E, 10F and 10G present a drawing of a vertical cut illustration of an illustrative lateral re-programmable antifuse construction.
Figure 10B:
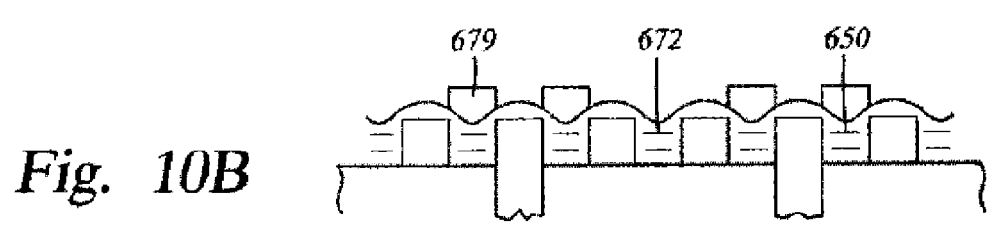
Figure 10C:
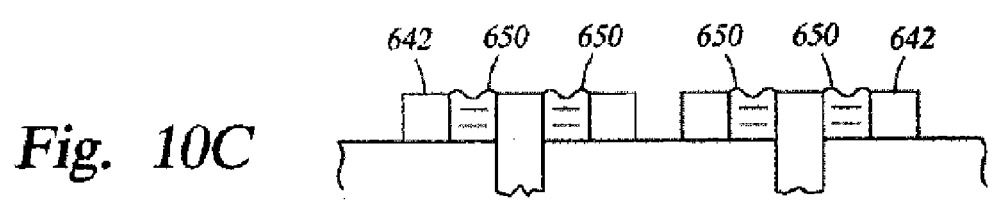

FIGS. 10A, 10B, 10C, 10D, 10E, 10F and 10G present a drawing of a vertical cut illustration of an illustrative lateral re-programmable antifuse construction. As shown in FIG. 10A, upper metal 642 is patterned and exposed by removing some of a dielectric layer. Then, the whole area, including vias 610, is covered with an antifuse material 672 such as, for example, $SiO_x$ as shown in FIG. 10B. Utilizing lithography, for example, a protective layer 679 may then be patterned to protect designated antifuses 650 as illustrated in FIG. 10B. Unprotected antifuse material may thereafter be removed, for example, by etching. Protective material is then removed to leave the strips of upper metal 642 and desired lateral antifuses 650 as illustrated in FIG. 10C.

Figure 10D:
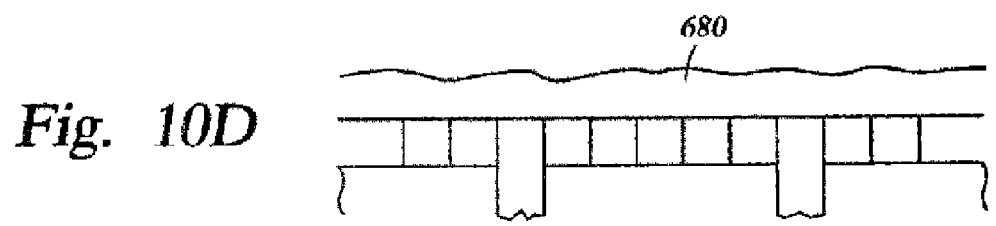
Figure 10E:
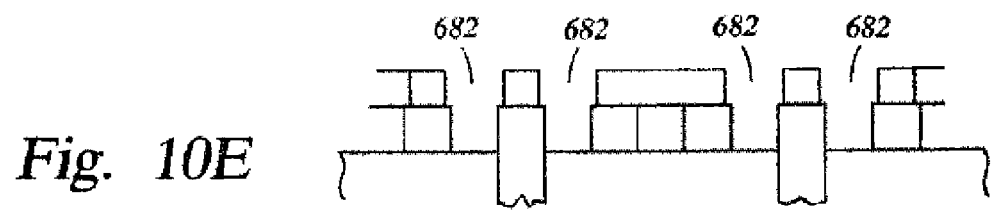
Figure 10F:
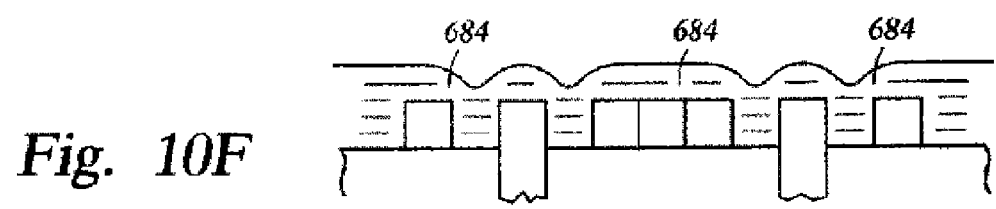
Figure 10G:
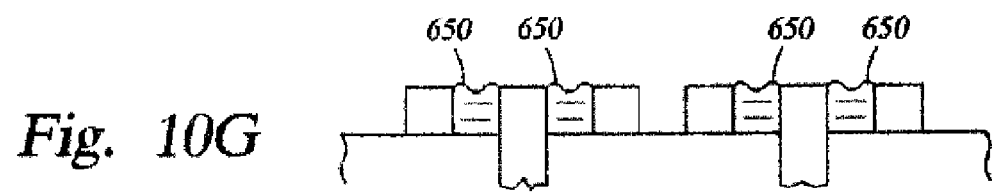

FIGS. 10D-10G illustrate an alternative approach for the construction of the lateral antifuses. Referring to FIG. 10D, an upper metal is patterned and covered by a protective layer 680, such as, for example, photo-resist. Utilizing lithography and etching, for example, locations 682 for antifuses may be exposed as illustrated in FIG. 10E. The resist is then removed, and then a layer of antifuse material 684 is deposited over the structure, as illustrated in FIG. 10F. Finally the excess antifuse material is removed via CMP or etch-back processing to leave lateral antifuses 650 in the designated locations 682 as illustrated in FIG. 10G. For carbon-based antifuses such as, for example, graphene-based antifuses, a "sacrificial oxide" can be deposited prior to the deposition of the carbon layer to provide an initial high resistivity.

As an alternative to the steps illustrated in FIGS. 10A-10G, an antifuse 650 may also be constructed from $SiO_x$. The $SiO_x$ is deposited using a similar flow to that presented in FIGS. 10A-10G. Alternatively, $SiO_x$ can be used for dielectric isolation and be deposited prior to the upper metal 642 like similar isolation layers.

Figure 11:
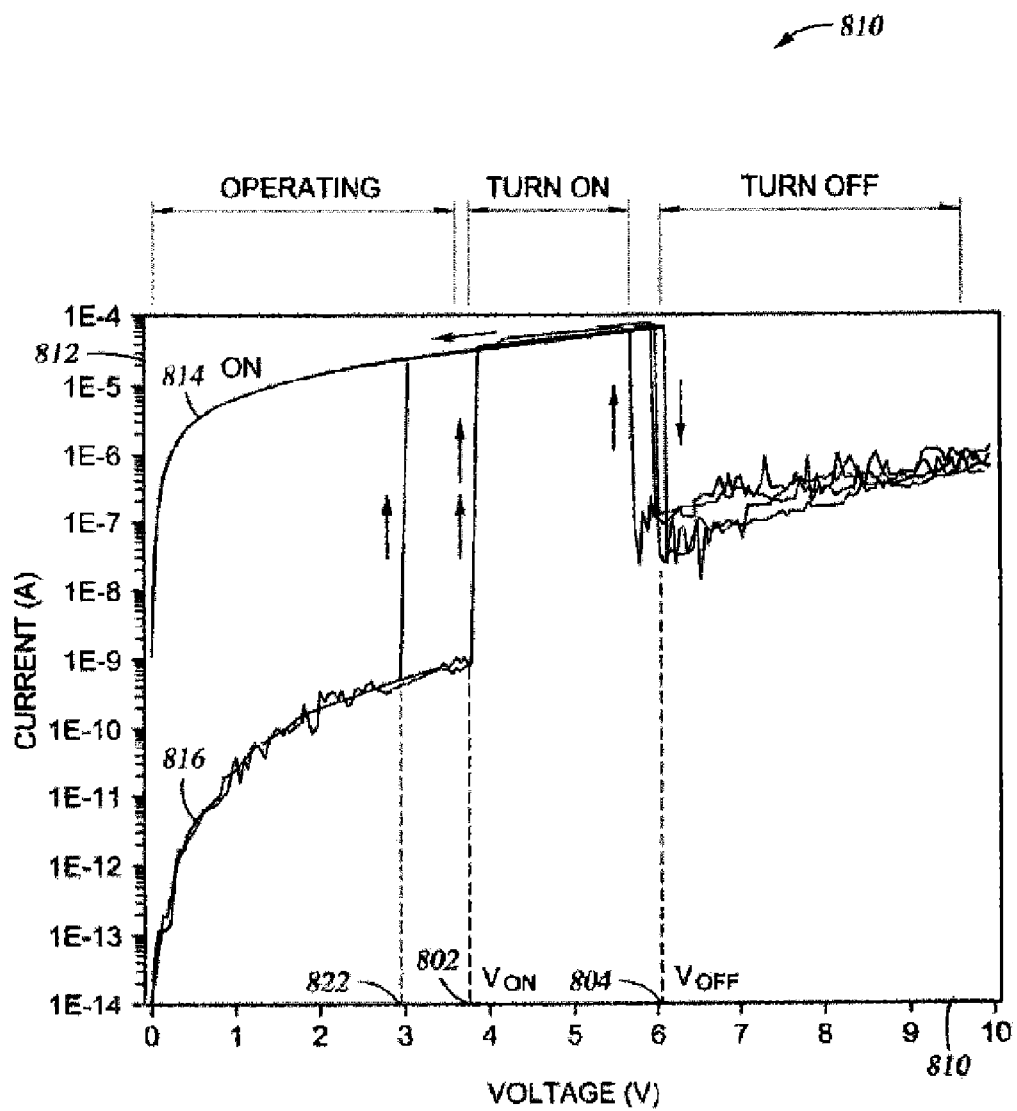
FIG. 11 presents a drawing illustration of an illustrative re-programmable antifuse current vs. voltage chart.

FIG. 11 presents a drawing illustration of an illustrative carbon-based re-programmable antifuse current vs. voltage chart 810. The re-programmable antifuse may have two stable states OFF and ON. Initially the antifuse may be in the OFF state as the "sacrificial oxide" 514 may cause it to be non-conducting. The two axes in chart 800 are current in the vertical direction 812 and voltage in the horizontal direction 810. The antifuse remains in the OFF state as long as the voltage across it does not exceed the $V_{breakdown}$ threshold 822. As shown in FIG. 11, the $V_{breakdown}$ threshold 822 is about 3 volt. However, other breakdown voltages are included within the spirit and scope of the disclosure. Once the antifuse has been turned ON it remains ON until turned OFF through a voltage pulse. In the ON state the re-programmable antifuse may act as a conducting via, allowing electronic signals to pass through it en route to their destinations. The re-programmable antifuse can be re-programmed to an OFF-state by applying an even higher voltage $V_{off}$ 804 across the antifuse as shown in FIG. 11. Once the re-programmable antifuse has been programmed to an OFF-state, it conducts at a very low voltage 816 and stays at this essentially non-conducting state as long as the voltage across it does not exceed $V_{on}$ threshold 802. In FIG. 11, the $V_{on}$ threshold 802 is about 4 volt. However, other ON voltages are included within the spirit and scope of the disclosure. The antifuse is turned ON by applying a voltage across it that is higher than the $V_{on}$ threshold 802 and turned OFF by applying an even higher voltage across it that is higher than $V_{off}$ 804. This behavior of the re-programmable antifuse is repeated to permit recurrent re-programming between OFF and ON states. The initial breakdown voltage $V_{breakdown}$ 822 may be impacted by the composition and/or the thickness of the "sacrificial oxide" 514. The turn ON voltage $V_{on}$ threshold 802 may be impacted by the length and/or composition of the antifuse 502. Accordingly in some structures, $V_{breakdown}$ 822 could be made to be higher than $V_{on}$ threshold 802.

Figure 12:
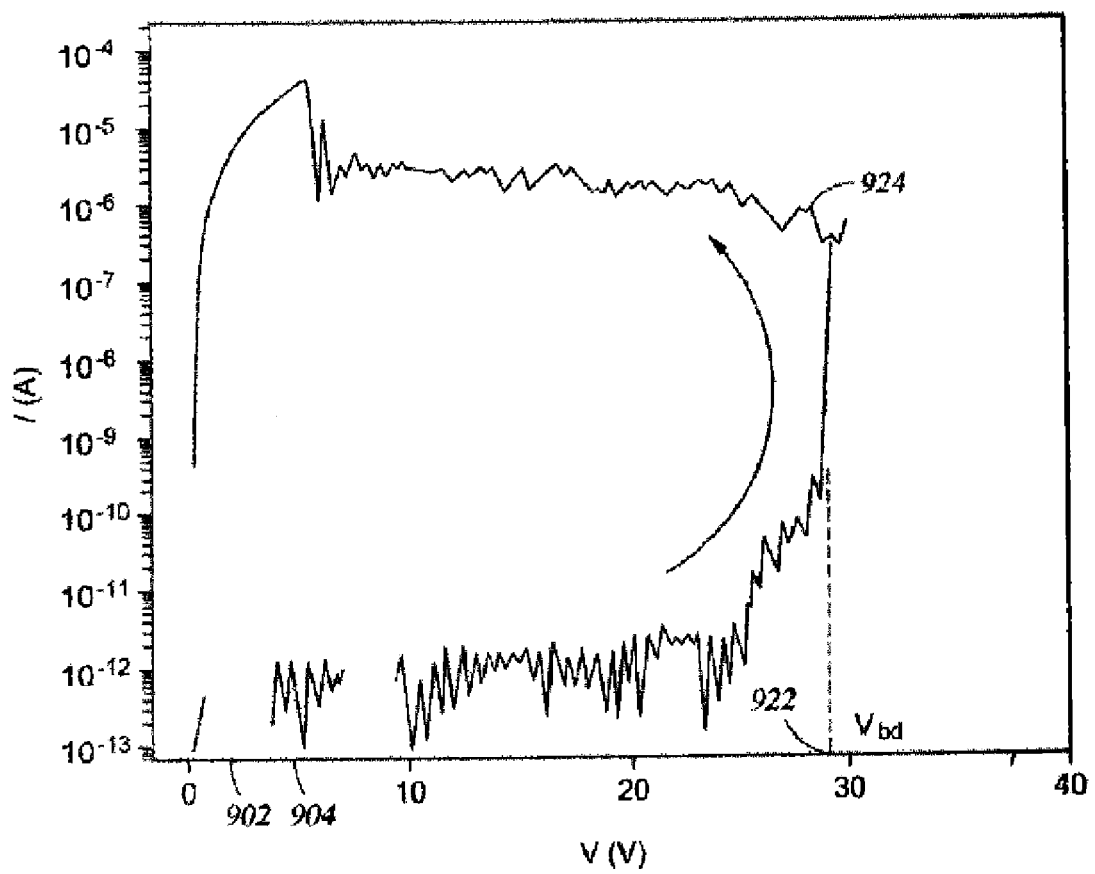
FIG. 12 presents a drawing illustration of an illustrative re-programmable antifuse current vs. voltage chart.
Figure 13:
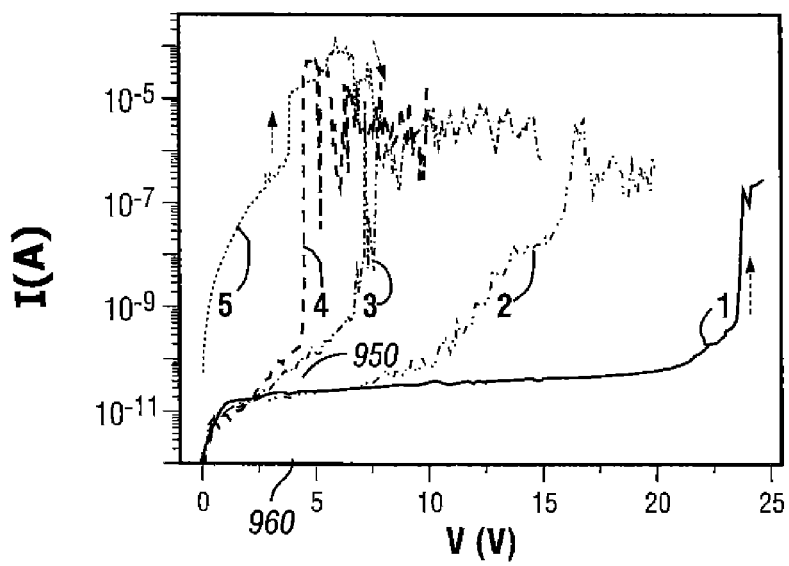
FIG. 13 presents a drawing illustration of an illustrative re-programmable antifuse current vs. voltage chart.

FIG. 12 presents a drawing illustration of an illustrative re-programmable antifuse current vs. voltage chart. The chart of FIG. 12 illustrates the initialization operation of an antifuse. Initialization may be required, for example, when the antifuse includes $SiO_x$. In the antifuse embodiments needing initialization, the antifuse may initially not conduct at all and even at $V_{on}$ 902 there may be only leakage current 904. A relatively very high breakdown voltage $V_{bd}$ 922 is required to activate the antifuse for the first time. Once the voltage across the antifuse increases over $V_{bd}$ 922 the antifuse is initialized to conduct, and the chart indicates rapid increase of current to the level 924. The antifuse can then be re-programmed as was described before. Initialization may take place over multiple voltage pulses or sweeps, as illustrated in FIG. 13. For example, FIG. 13 shows five initialization voltage sweeps 1-5, each demonstrating a progressively lower initialization voltage. For the first four voltage sweeps 1-4, there is leakage current 950. After initialization voltage sweep 5, the antifuse can then be programmed as previously described at $V_{ON}$ 960.

Figure 14:
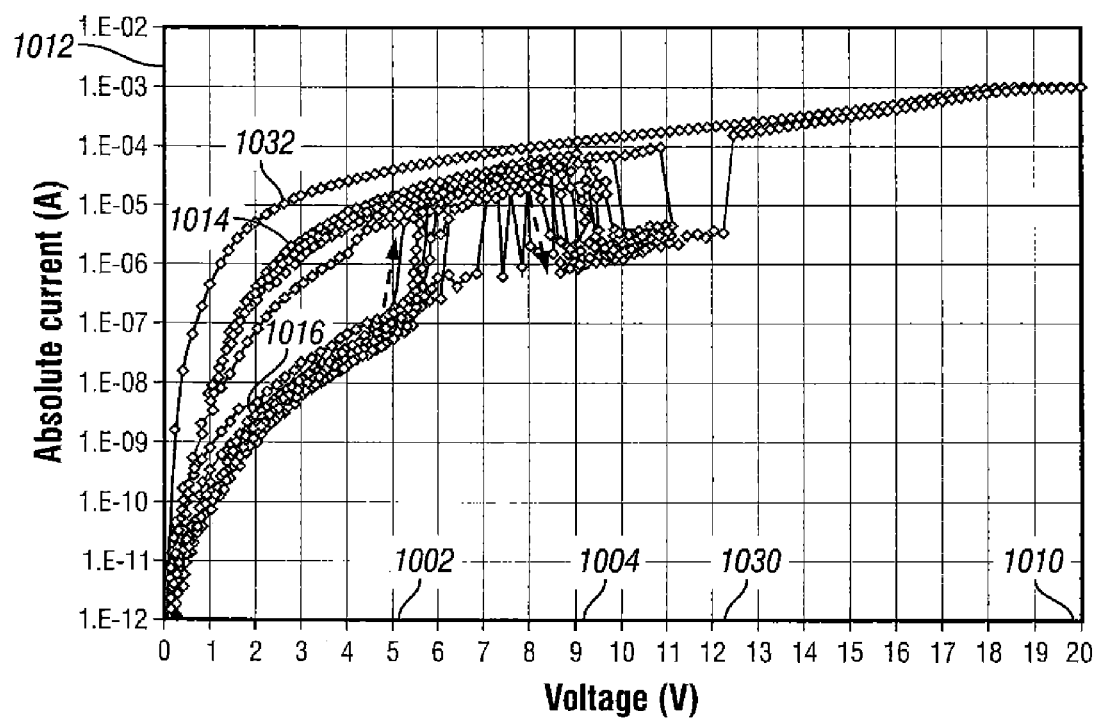
FIG. 14 presents a drawing illustration of an illustrative re-programmable antifuse current vs. voltage chart.

FIG. 14 presents a drawing illustration of an illustrative re-programmable antifuse current vs. voltage chart 1000. The re-programmable antifuse may have two stable states OFF and ON. Initially the antifuse may be in the OFF state and thus non-conducting. The two axes in chart 1000 are current in the vertical direction 1012 and voltage in the horizontal direction 1010. The antifuse may remain in the OFF state as long as the voltage across it does not exceed the $V_{on}$ threshold 1002, which may be, for example, about 5 volts. $V_{on}$ threshold 1002 may be a function of the re-programmable antifuse construction, including, for example, the thickness or composition of the $SiO_x$ layer. The antifuse may be designed to be well over the operating voltage within the device so that normal operation does not cause a change to the re-programmable antifuse state. To turn the re-programmable antifuse to an ON state, a voltage exceeding the $V_{on}$ threshold 1002 is applied. Once the antifuse has been turned ON it may then stay ON and conduct current 1014. In the ON state the re-programmable antifuse acts as a conducting via and allows electronic signals to pass through it en route to their destinations. The re-programmable antifuse may be re-programmed to an OFF state by applying, for example, an even higher voltage across it, e.g., $V_{off}$ 1004. Once the re-programmable antifuse has been programmed to an OFF-state, it conducts a very low current 1016 and stays at this low or essentially non-conducting state as long as the voltage across it does not exceed the $V_{on}$ threshold 1002. This behavior of the re-programmable antifuse permits re-programming between OFF and ON states. In addition, a voltage higher than $V_{off}$ 1004, named $V_{Bon}$ 1030, may be applied across the antifuse to program the antifuse to a permanent conductive state. Now the ON antifuse conducts current 1032 and may no longer be programmed to an OFF state. Additionally, further pulsing of current and voltage may be applied to the permanently ON antifuse to form an even more conductive ON state.

From the foregoing description, one of ordinary skill in the art can easily ascertain the essential characteristics of this disclosure, and without departing from the spirit and scope thereof, can make various changes and modifications to adapt the disclosure to various usages and conditions. The embodiments described hereinabove are meant to be illustrative only and should not be taken as limiting of the scope of the disclosure, which is defined in the following claims.

What is claimed is the following:

1. An integrated circuit device comprising:
    a configurable interconnect circuit comprising at least one antifuse;
        wherein the at least one antifuse is configured to be programmed to be conducting by applying a first voltage across it and is configured to be re-programmed to be non-conducting by applying second voltage across it; and
        wherein the at least one antifuse is further configured to be permanently conducting by applying a third voltage across it;
            wherein the third voltage is higher than the first voltage or the second voltage.

2. The integrated circuit device of claim 1, wherein the configurable interconnect circuit further comprises:
    a first layer of conductive first strips;
    an insulation layer; and
    a second layer of conductive second strips;
        wherein the conductive second strips are arranged in a substantially perpendicular orientation to the conductive first strips.

3. The integrated circuit device of claim 2, wherein the insulation layer includes the at least one antifuse; and
   wherein the at least one antifuse is in a region directly above the conductive first strips and directly below the conductive second strips.

4. The integrated circuit device of claim 3, wherein the at least one antifuse comprises $SiO_x$; and
   wherein x has a value higher than 1 and less than or equal to 2.

5. The integrated circuit device of claim 3, wherein the at least one antifuse comprises more than one layer of $SiO_x$;
   wherein x has a value higher than 1 and less than or equal to 2; and
      wherein the value of x is not the same in each layer of $SiO_x$.

6. The integrated circuit device of claim 3, wherein the at least one antifuse comprises carbon.

7. The integrated circuit device of claim 6, wherein the at least one antifuse further comprises a sacrificial layer.

8. The integrated circuit device of claim 2, wherein the second layer of conductive second strips further comprises at least one strip of re-programmable antifuse oriented substantially perpendicular with respect to the conductive second strips.

9. The integrated circuit device of claim 8, wherein the at least one strip of re-programmable antifuse comprises $SiO_x$;
   wherein x has a value higher than 1 and less than or equal to 2.

10. The integrated circuit device of claim 8, wherein the at least one strip of re-programmable antifuse comprises more than one layer of $SiO_x$;
    wherein x has a value higher than 1 and less than or equal to 2; and
       wherein the value of x is not the same in each layer of $SiO_x$.

11. The integrated circuit device of claim 8, wherein the at least one strip of re-programmable antifuse comprises carbon.

12. The integrated circuit device of claim 11, wherein the at least one strip of re-programmable antifuse further comprises a sacrificial layer.

13. The integrated circuit device of claim 1, wherein the second voltage is higher than the first voltage.

14. An integrated circuit device comprising:
    a configurable interconnect circuit arranged to be configurable by at least one antifuse;
       wherein the at least one antifuse is configured to be activated by applying a first voltage across it and to be programmed to be conducting by then applying a second voltage across it;
       wherein the at least one antifuse is further configured be re-programmed to be non-conducting by applying a third voltage across it; and
       wherein the at least one antifuse is further configured to be permanently conducting by applying a fourth voltage across it;
          wherein the fourth voltage is higher than the first voltage, the second voltage or the third voltage.

15. The integrated circuit device of claim 14, wherein the configurable interconnect circuit further comprises:
    a first layer of conductive first strips;
    an insulation layer; and
    a second layer of conductive second strips;
       wherein the conductive second strips are arranged in a substantially perpendicular orientation with respect to the conductive first strips.

16. The integrated circuit device of claim 15, wherein the insulation layer includes the at least one antifuse; and
    wherein the at least one antifuse is in a region directly above the conductive first strips and directly below the conductive second strips.

17. The integrated circuit device of claim 16, wherein the at least one antifuse comprises $SiO_x$; and
    wherein x has a value higher than 1 and less than or equal to 2.

18. The integrated circuit device of claim 16, wherein the at least one antifuse comprises more than one layer of $SiO_x$;
    wherein x has a value higher than 1 and less than or equal to 2; and
       wherein the value of x is not the same in each layer of $SiO_x$.

19. The integrated circuit device of claim 16, wherein the at least one antifuse comprises carbon.

20. The integrated circuit device of claim 19, wherein the at least one antifuse further comprises a sacrificial layer.

21. The integrated circuit device of claim 15, wherein the second layer further comprises at least one strip of re-programmable antifuse oriented substantially perpendicular with respect to the conductive second strips.

22. The integrated circuit device of claim 21, wherein the at least one strip of re-programmable antifuse comprises $SiO_x$;
    wherein x has a value higher than 1 and less than or equal to 2.

23. The integrated circuit device of claim 21, wherein the at least one re-programmable antifuse comprises more than one layer of $SiO_x$;
    wherein x has a value higher than 1 and less than or equal to 2; and
       wherein the value of x is not the same in each layer of $SiO_x$.

24. The integrated circuit device of claim 21, wherein the at least one strip of re-programmable antifuse comprises carbon.

25. The integrated circuit device of claim 24, wherein the at least one strip of re-programmable antifuse further comprises a sacrificial layer.

26. The integrated circuit device of claim 14, wherein the first voltage is higher than the third voltage; and
    wherein the third voltage is higher than the second voltage.

* * * * *